United States Patent [19]
Chang-Hasnain et al.

[11] Patent Number: 5,771,253
[45] Date of Patent: Jun. 23, 1998

[54] HIGH PERFORMANCE MICROMECHANICAL TUNABLE VERTICLE CAVITY SURFACE EMITTING LASER

[75] Inventors: Constance J. Chang-Hasnain, Union City; Edward C. Vail, Palo Alto; Marianne S. Wu, Stanford, all of Calif.

[73] Assignee: The Board of Trustees of the Leland Stanford Junior University

[21] Appl. No.: 791,762

[22] Filed: Jan. 29, 1997

Related U.S. Application Data

[63] Continuation-in-part of Ser. No. 542,057, Oct. 13, 1995, Pat. No. 5,629,951.
[51] Int. Cl.$^6$ .............................. G02B 6/26; G02B 6/42
[52] U.S. Cl. ............................ 372/20; 372/32; 372/96
[58] Field of Search .................... 372/20, 32, 92, 372/96, 107

[56] References Cited

U.S. PATENT DOCUMENTS 5,629,951  5/1997  Chang-Hasnain et al. .............. 372/20

*Primary Examiner*—Rodney B. Bovernick
*Assistant Examiner*—Robert E. Wise
*Attorney, Agent, or Firm*—Lumen Intellectual Property Services

[57] ABSTRACT

An electrostatically controlled cantilever apparatus for continuous tuning of the resonance wavelength of a Fabry-Perot cavity is disclosed. A resonant cavity is formed between two distributed Bragg reflector (DBR) mirrors each composed of multiple DBR layers. One such layer is replaced with a layer which has been fully oxidized except for a small aperture. This layer provides both optical and current confinement which allows for low threshold currents and high output power.

7 Claims, 3 Drawing Sheets

5,771,253

HIGH PERFORMANCE MICROMECHANICAL TUNABLE VERTICLE CAVITY SURFACE EMITTING LASER

This Application is a continuation-in-part of application Ser. No. 08/542,057, now U.S. Pat. No. 5,629,951, filed Oct. 13, 1995 entitled "Widely Tunable Surface Emitting Laser".

This invention was made with Government support under contract no. NSF-2MWF248, awarded by the National Science Foundation (NSF). The Government has certain rights in the invention.

BACKGROUND—FIELD OF THE INVENTION

The present invention relates to the field of semiconductor laser cavities, and in particular to Fabry-Perot cavities where an oxidation layer is used for optical and current confinement and a cantilever structure is used to vary the resonance wavelength by varying the cavity size.

BACKGROUND—DESCRIPTION OF PRIOR ART

Optical communications systems promise to revolutionize the field of telecommunications. However, numerous technological obstacles loom in the way. The main one is the lack of widely tunable semiconductor filters/detectors and lasers yielding stable single-mode emission. In other words, there are no suitable structures and/or methods for adjusting the resonant wavelength of a single-mode laser cavity.

A number of schemes have been proposed and studied to obtain frequency tuning of semiconductor lasers. These methods have typically relied on tuning the index of refraction of the optical cavity. Such index adjustment can be induced by heating, the electro-optic effect, and carrier injection. However, the index variance is relatively small. The resulting tunable range is restricted to approximately 1 percent.

In addition, the bulk of these tuning schemes have been attempted with edge emitting laser structures. Unlike vertical cavity surface emitting lasers (VCSEL), these structures are not inherently single-mode and consequently the use of distributed Bragg reflectors or distributed feedback, both of which are difficult to fabricate, are required to select a single mode.

Interferometric techniques which rely on variable selection of different Fabry-Perot modes from a comb of modes have been proposed. Among these are asymmetric y-branch couplers and vertical cavity filters. These methods produce tuning ranges of up to 100 nm, however, they are restricted to discrete tuning only.

The idea of electrostatically deflecting the top reflector in a VCSEL has previously been proposed by Pezeshki et al. However, their proposal focuses on suspended membranes which are intrinsically sensitive to stress gradients since no expansion or contraction of the suspended layer can be accommodated. Further, their proposal focuses on the idea of a suspended aluminum layer which may in itself form the mirror or the last layer of a multi-layer mirror. This structure is neither easy to fabricate or capable of a wide tuning range.

Moreover, most of the above mentioned techniques are polarization-sensitive. This means that they cannot be easily adapted to optical communications systems which need to be reliable and insensitive to minor parameter changes.

VCSELs possess desirable qualities for telecommunications—circular mode profile, single mode operation, surface normal operation and compact size. However, micromechanical tunable VCSELs have to date suffered from higher threshold currents and lower output powers. Typical temperature tuned VCSELs yield output powers of around 1 mW with threshold currents around 200 $\mu$A. These devices can only be tuned about 8–10nm.

OBJECTS AND ADVANTAGES OF THE INVENTION

In view of the above, it is an object of the present invention to provide an apparatus for tuning the resonance wavelength of a Fabry-Perot cavity in a continuous manner over a wide range of wavelengths. A further object of the invention is to ensure that such apparatus is polarization-insensitive. Another object of the invention is to provide that such an apparatus operate at low threshold currents and yield high output power. Yet another object of the invention is to provide that such apparatus can operate as a laser or a filter/detector. Finally, it is another object of the invention that this apparatus be simple in construction, easy to control, and straightforward to manufacture.

These and other objects and advantages will become more apparent after consideration of the ensuing description and the accompanying drawings.

SUMMARY OF THE INVENTION

The objects and advantages of the invention are achieved with an electrostatically controlled cantilever apparatus. A vertical Fabry-Perot cavity is formed between two distributed Bragg reflector (DBR) mirrors. Both top and bottom mirrors are composed of multiple DBR layers. The top mirror is composed of two sets of DBR layers separated by an air space of variable thickness. The top-most layers are supported in a freely suspended cantilever. The air space can be controlled by electrostatically deflecting the cantilever. Changing the thickness of the air space effectively changes the resonant wavelength of the Fabry-Perot Cavity. One of the DBR layers is replaced with a slightly different material that can be oxidized. Oxidation of this layer is complete except for an area of controlled aperture. The oxidation acts as an insulating layer leaving only the unoxidized area through which current can pass. Moreover, the oxidized area has a lower refractive index than the unoxidized aperture keeping the light focused in the unoxidized area. Current and optical confinement is thus achieved. The device can be oxidized to apertures of various diameters.

The invention will now be explained in detail in the description with reference to the attached drawing figures.

DESCRIPTION

Figure 1A:
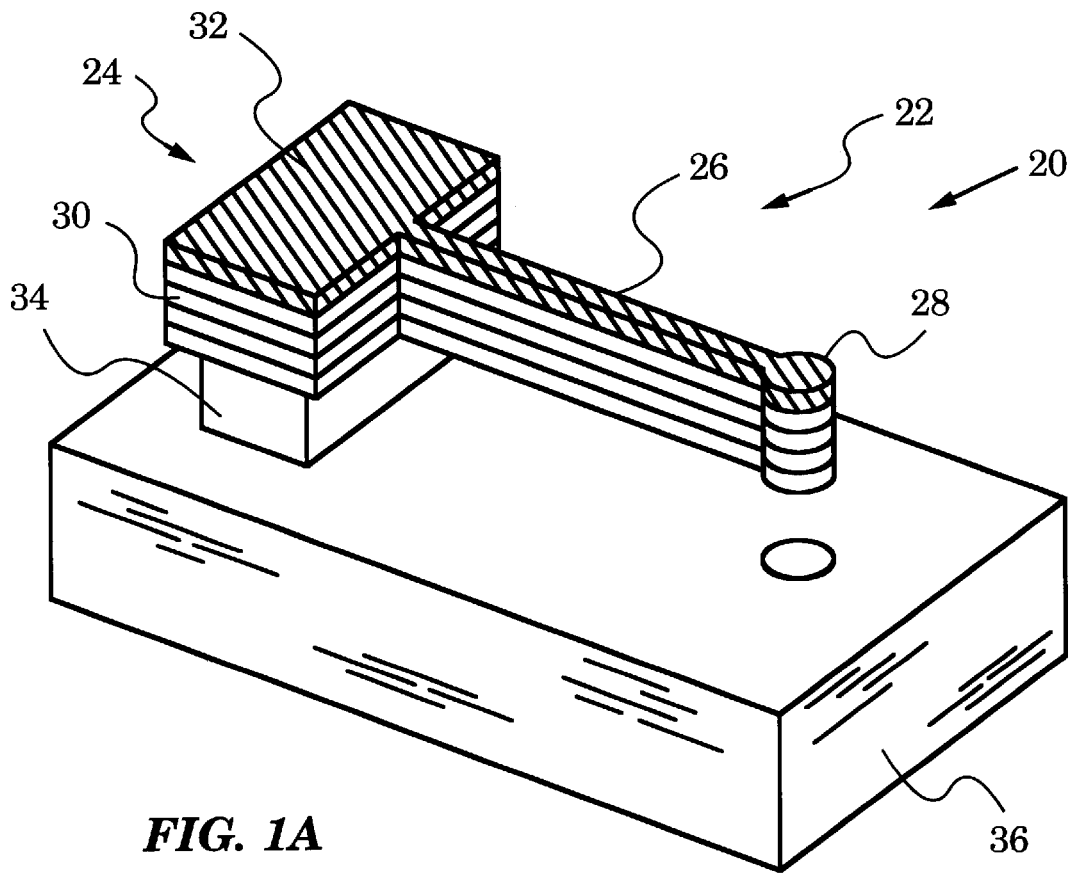
FIG. 1A is a perspective view of a single-arm cantilever apparatus according to the invention.

A cantilever apparatus according to the invention is based on the principle of an electrostatic force pulling on a simple cantilever arm. FIG. 1A shows a simple embodiment of such an apparatus in perspective.

In particular, a cantilever apparatus 20 has a cantilever structure 22 consisting of a base 24, an arm 26, and an active head 28. In the embodiment shown, the bulk of cantilever structure 22 consists of layers of distributed Bragg reflector (DBR) pairs 30. It is easiest to make layers 30 of AlGaAs. The DBR pairs are made of AlGaAs with different compositional ratios, e.g., $Al_{0.09}Ga_{0.9}As/Al_{0.58}Ga_{0.42}As$. The top-most layer of 30 is heavily doped to ensure good contact with an electrical tuning contact 32 deposited on top of cantilever structure 22.

The actual number of layers 30 may vary depending on the desired reflectivity of DBR 30. It is common to use many layers to ensure sufficient reflectivity. In this particular embodiment there are 22½ DBR pairs. Furthermore, any suitable reflecting material other than AlGaAs may be used to produce DBR layers 30. A person skilled in the art will be able to chose the right materials and dimensional parameters for layers 30. Finally, it is not even necessary that arm 26 or base 24 be made up of layers 34, as long as active head 28 includes them.

In the embodiment shown, base 24 is rectangular and suitably large to ensure dimensional stability of cantilever structure 22. In particular arm 26 is 200 $\mu$m long, 3.3 $\mu$m thick and 1.5 $\mu$m wide. Shorter lengths require thinner arms to maintain sufficient flexibility. Excessive lengths, on the other hand, make arm 26 difficult to handle during fabrication. The preferred diameter of active head 28 falls between 10 and 20 $\mu$m.

Electrical tuning contact 32 resides on top of cantilever structure 22. In this embodiment tuning contact 32 is made of 1500 Å of gold and covers the entire top surface of cantilever structure 22. However, any other electrically conducting material can be used and it is not necessary that the entire top surface of cantilever structure 32 be covered. The only limitation is that tuning contact 32 be sufficiently large to allow application of sufficient force $F_d$ to deflect arm 26.

Base 24 rests on a support block 34 across which a voltage can be sustained. In this case block 34 is composed of GaAs. Block 34, in turn, sits on an electrically responsive substrate 36, preferably made of suitably doped GaAs. A voltage difference between layers 30 and substrate 36 causes deflection of arm 26 towards substrate 36. With layers 30 and substrate 36 oppositely doped, a reverse bias voltage can be established between them. Substrate 36 is sufficiently thick to provide mechanical stability to entire cantilever apparatus 20.

Figure 1B:
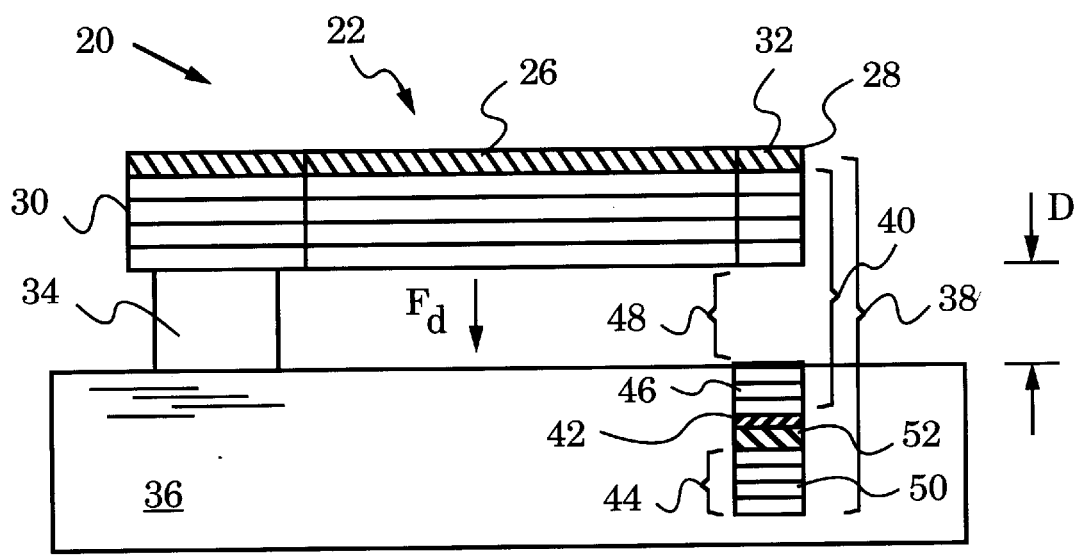
FIG. 1B is a side view of the cantilever apparatus of FIG. 1A.

As shown in FIG. 1B, inside substrate 36 are lodged additional reflective layers 46, a triple quantum well active region 52 and a bottom reflector 50 composed of DBR layers 44. The active region is usually separated from the reflectors by spacer layer 42.

Fabry-Perot cavity 38 is formed by top reflector 40, active region 52 and bottom reflector 44. The top reflector 40 is comprised of three distinct parts—the top-most and middle sets of DBR semiconductor layers separated by a tunable air gap 48. The middle DBR layers and the top DBR layers have opposite doping.

Figure 2:
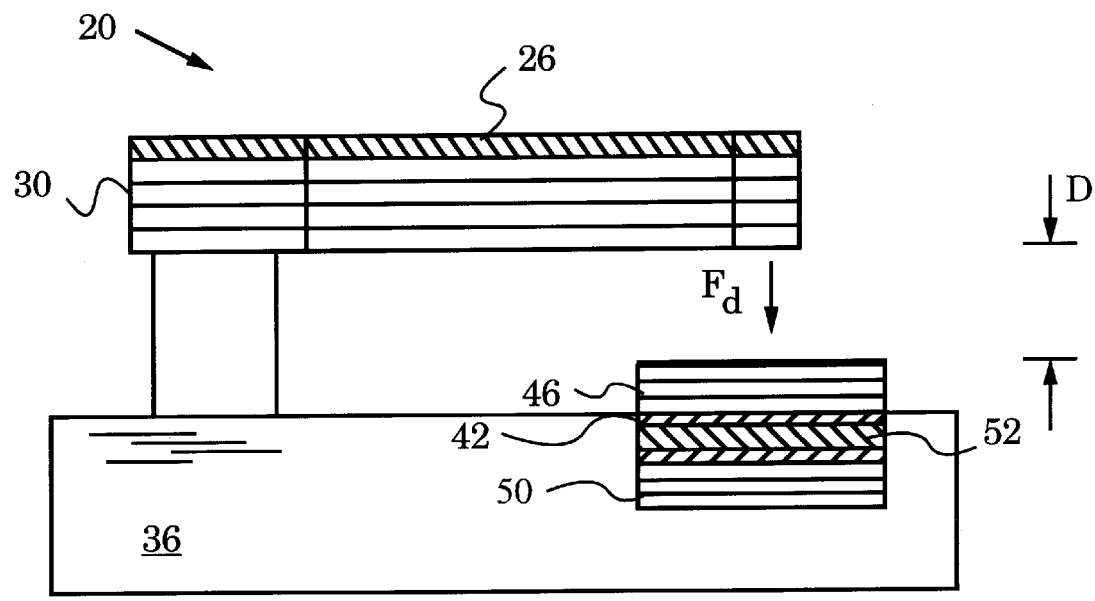
FIG. 2 is a side view of the apparatus modified such that the middle DBR layers are not lodged within the substrate.

As discussed above, the top-most DBR layers 30 are contained in the active head 28. In FIG. 1B the middle set of DBR layers 46, is lodged inside substrate 36. However, the middle reflective layers 46 need not be lodged within the substrate. FIG. 2 shows an embodiment in which the middle DBR layers 46 are on top of the substrate.

The bottom reflector 44 is composed of DBR pairs 55. As with the number of layers 30 and 46 in the top reflector 40, the actual number of layers 50 in bottom reflector 44 may vary. It is common to have multiple layers 50 to provide sufficient reflectivity. In this embodiment the middle set of DBR layers is comprised of 4½ pairs 46 and bottom reflector 44 is composed of 24 DBR pairs 50.

The DBR layers are doped to provide the appropriate biasing. The middle set of DBR layers 46 and the bottom DBR layers 50 have opposite doping. This allows active region 52 to be pumped by passing current between layers 46 and layers 50. In FIG. 1B the top DBR layers and the substrate have opposite bias to allow electrostatic deflection of cantilever arm 26 as discussed below. In FIG. 2 the top-most DBR layers 30 and middle layers 46 have opposite bias to allow electrostatic deflection of the cantilever. In this embodiment to top-most layers 30 and bottom-most layers 50 are n-doped. The middle set of DBR layers 46 are p-doped.

The height of block 30 is 1.5 $\mu$m; thus cantilever structure 22 hovers a distance D=1.5 $\mu$m above substrate 36. Of course, block 30 could be significantly higher or lower, depending on the length of arm 26 and the desired tuning range.

To tune Fabry-Perot cavity 38 a tuning voltage $V_t$ is applied to tuning contact 32. This results in charge accumulation in contact 32. The charge on contact 32 causes an equal and opposite charge to amass at the surface of electrically responsive substrate 36. These attracting charges produce a vertical force $F_d$ acting on arm 26 and active head 28 causing arm 26 to deform thereby reducing distance D.

As distance D decreases so does the effective length of the Fabry-Perot cavity 38. Changing the cavity length alters the resonance wavelength of the cavity. Thus decreasing the distance D results in a decrease in the resonance wavelength of the cavity. Furthermore, since the deflection of arm 26 is continuous in applied voltage $V_t$, and since $V_t$ can be adjusted continuously, the tuning of the wavelength is continuous.

Figure 3:
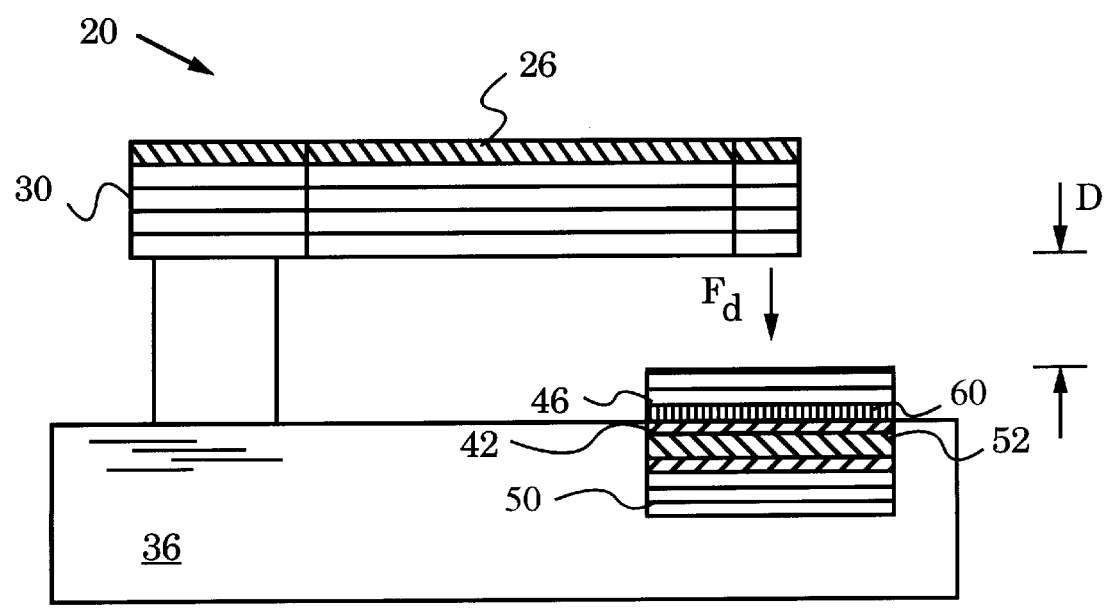
FIG. 3 is a side view of the apparatus of FIG. 2 with the oxidation layer replacing the bottom DBR pair of the middle DBR layers.
Figure 4:
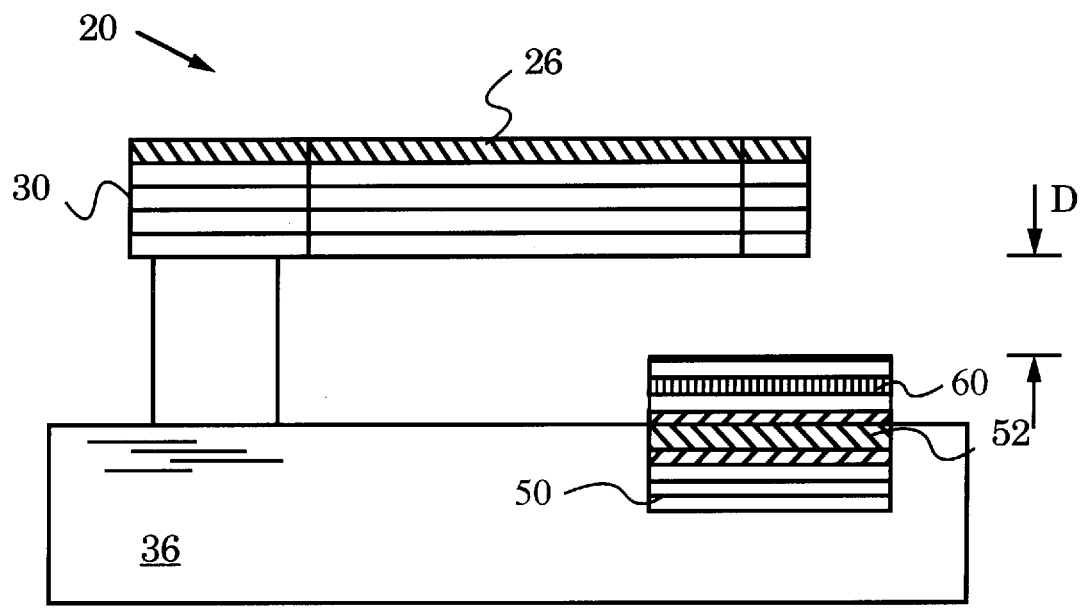
FIG. 4 is a side view of the apparatus of FIG. 2 with the oxidation layer found within the middle DBR layers

The above embodiment is based on simple DBR layering. A modification of the DBR layers is more advantageous. The preferred embodiment of apparatus 50, according to the invention is shown in FIG. 3. In this embodiment, one of the DBR layers 46 of the middle set of DBR pairs is substituted with an oxidation layer 60. In this embodiment layer 60 is comprised of ¾ λ AlAs which has been laterally oxidized. As shown in FIG. 3, it is convenient to place oxidation layer 60 at the bottom of the middle set of DBR pairs immediately adjacent to the spacer layer 42 and active region 52. However, the oxidation layer need not be located there. As shown in FIG. 4, oxidation layer 60 may replace any DBR pair. The distance of the oxidation layer from the active region determines the amount of current confinement.

Figure 5:
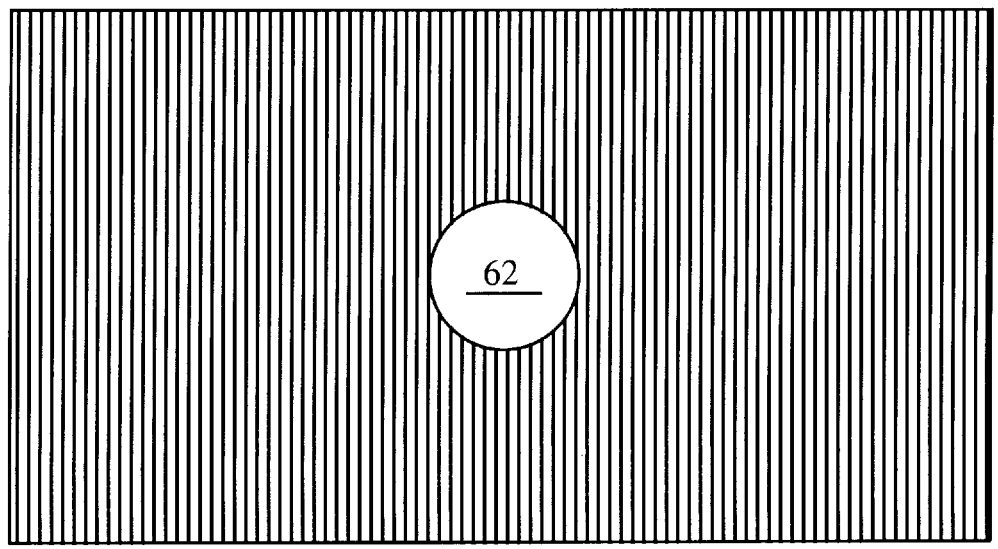
FIG. 5 is a bottom view of the oxidation layer.

Oxidation layer 60 provides both optical and current confinement. As shown in FIG. 5, the layer is oxidized to a specified aperture 62. The oxidation acts as an insulator allowing current to pass only through aperture 62. In addition, the refractive index of the oxidized area is lower than that of the unoxidized aperture. Thus, the unoxidized aperture acts as a focusing element, confining the beam to a region under the active head of the cantilever. The optical field strength at the oxidation layer determines the amount of optical confinement. The resulting wave guiding and confinement reduces threshold currents and increases output power.

For a specific structure, with layer 60 oxidized to an aperture of 10 $\mu$m, the device tuned over 19.1 nm with an applied voltage $V_t$ of 14.4V. The tuning current was less than 0.5 µA at all times and the threshold current was less than 5.4 mA over 18 nm and less than 8.5 mA over the entire 19.1 nm. When oxidized to an aperture of 5 µm the threshold current was 460 µA and the peak output was 0.9 mW over a tuning range of 7 nm with $V_t$=22V. This represents the widest tuning range, the lower threshold current, and the highest power ever achieved with a micromechanical tunable VCSEL. It also represents the widest continuous tuning range for any monolithic semiconductor laser. In addition, this threshold current and output power is on par with that of the best VCSELs.

SUMMARY, RAMIFICATIONS, AND SCOPE

There are many ways to build an apparatus similar to the one described above without departing from the spirit of the invention. Therefore, the scope of the invention should be determined, not by examples given, but by the appended claims and their legal equivalents.

We claim:

1. A cantilever apparatus for tuning the resonance wavelength of a Fabry-Perot cavity, said Fabry-Perot cavity comprising a bottom reflecting means and a top reflecting means, said cantilever apparatus comprising:
   a) an electrically responsive substrate;
   b) a support block positioned on said electrically responsive substrate;
   c) a cantilever structure comprising a base section resting on said support block, a deformable section extending above said electrically responsive substrate and creating an air gap between said deformable section and said electrically responsive substrate, and an active head positioned at a predetermined location on said deformable section and comprising at least a portion of said top reflecting means;
   d) an electrical tuning contact disposed on said cantilever structure for applying a tuning voltage $V_t$ to produce a downward electrostatic force $F_d$ between said electrical tuning contact and said electrically responsive substrate, thereby altering the size of said air gap and tuning said resonant wavelength;
   e) an oxidation layer disposed within one of said reflecting means, said oxidation layer having been partially oxidized so that a small aperture of unoxidized area remains thereby providing optical and current confinement.

2. The apparatus of claim 1 wherein said oxidation layer occupies the bottom layer of said top reflecting means.

3. The apparatus of claim 1 wherein said reflecting means comprise multiple layers of distributed Bragg reflector (DBR) pairs, and said oxidation layer replaces one of said DBR layers.

4. The apparatus of claim 3 wherein said oxidation layer replaces the bottom DBR pair of said top reflecting means.

5. The apparatus of claim 3 or 4 wherein said oxidation layer is composed of AlAs.

6. A method for tuning a resonance wavelength of a Fabry-Perot cavity using a cantilever structure comprising a base section, a deformable section, and an active head, said Fabry-Perot cavity comprising a bottom reflecting means and a top reflecting means, said method comprising the steps of:
   a) disposing an oxidation layer within one of said reflecting means;
   b) partially oxidizing said layer such that a small aperture is left unoxidized thereby providing optical and current confinement;
   c) positioning a support block on an electrically responsive substrate containing said Fabry-Perot cavity;
   d) producing said cantilever structure on said support block such that said active head contains at least a portion of said top reflecting means and is positioned above said Fabry-Perot cavity, and said deformable section extends above said electrically responsive substrate and creates an air gap between said deformable section and said electrically responsive substrate;
   e) disposing an electrical tuning contact on said cantilever structure;
   f) applying a tuning voltage $V_t$ to produce a vertical electrostatic force $F_d$ between said electrical tuning contact and said electrically responsive substrate, thereby altering the size of said air gap and tuning said resonant wavelength.

7. The method of claim 6 wherein said oxidation layer is disposed at the bottom of the top reflective means.

* * * * *